US010677817B2

(12) United States Patent
Yang et al.

(10) Patent No.: US 10,677,817 B2
(45) Date of Patent: Jun. 9, 2020

(54) METHOD FOR OSCILLOSCOPE 3D MAPPING IN SCAN MODE

(71) Applicant: UNIVERSITY OF ELECTRONIC SCIENCE AND TECHNOLOGY OF CHINA, Chengdu, Sichuan (CN)

(72) Inventors: Kuojun Yang, Chengdu (CN); Wuhuang Huang, Chengdu (CN); Peng Ye, Chengdu (CN); Qinchuan Zhang, Chengdu (CN); Hao Zeng, Chengdu (CN); Duyu Qiu, Chengdu (CN); Jun Jiang, Chengdu (CN); Huiqing Pan, Chengdu (CN); Lianping Guo, Chengdu (CN); Feng Tan, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 317 days.

(21) Appl. No.: 15/879,146

(22) Filed: Jan. 24, 2018

(65) Prior Publication Data

US 2018/0149676 A1 May 31, 2018

(30) Foreign Application Priority Data

Nov. 14, 2017 (CN) .......................... 2017 1 1118232

(51) Int. Cl.
*G01R 13/02* (2006.01)
(52) U.S. Cl.
CPC ................... *G01R 13/02* (2013.01)

(58) Field of Classification Search
None
See application file for complete search history.

(56) References Cited

U.S. PATENT DOCUMENTS

| 5,438,531 A | 8/1995 | Shank |
| 5,987,246 A * | 11/1999 | Thomsen ................. G06F 8/34 |
| | | 345/501 |

(Continued)

OTHER PUBLICATIONS

Yang et al., A Seamless Acquisition Digital Storage Oscilloscope with Three-Dimensional Waveform Display, Review of Scientific Instruments 85, 045102, 1-10 (Year: 2014).*

(Continued)

*Primary Examiner* — Roy Y Yi
(74) *Attorney, Agent, or Firm* — Oliff PLC

(57) ABSTRACT

A method for oscilloscope 3D mapping in scan mode. The input signal is acquired using a real-time sampling rate which is $D_r$ times higher, thus more sampling points, i.e. $D_r$ acquired data can be obtained during the time interval between two consecutive horizontal pixels. The $D_r$ acquired data are mapped into a same column of the screen to implement fluorescent waveform display. In addition, to realize the scanning display, a flag X is introduced into the three-dimensional database, when the screen refresh signal arrives, the first $D_s$ acquired data are read out from the unread acquired data in FIFO memory. The three-dimensional database is updated from the flag X, which make the leftmost waveform always be the oldest waveform, the rightmost waveform always be the newest waveform. Thus the 3D mapping is realized in scan mode, letting the DSO have a fluorescent waveform display at slow time-base.

1 Claim, 3 Drawing Sheets

(56) References Cited

U.S. PATENT DOCUMENTS 6,151,010 A * 11/2000 Miller .................. G01R 13/02
345/440.1
6,222,521 B1  4/2001 Ivers et al.
8,648,887 B2  2/2014 Tian et al.

OTHER PUBLICATIONS

Qinchuan et al. New Method for Measurement of Waveform Capture Rate Using Random Signal, IEEE 12th International Conference on Electronic Measurement & Instruments, 2015, 999-1003 (Year: 2015).*

* cited by examiner

METHOD FOR OSCILLOSCOPE 3D MAPPING IN SCAN MODE

FIELD OF THE INVENTION

This application claims priority under the Paris Convention to Chinese Patent Application No. 201711118232.7, Filed on Nov. 14, 2017, the entirety of which is hereby incorporated by reference for all purposes as if fully set forth herein.

The present invention relates to the field of waveform display, more particularly to a method for oscilloscope 3D (three-dimensional) mapping in scan mode.

BACKGROUND OF THE INVENTION

Scan mode is a special way of waveform display, when the oscilloscope is at slow time-base. As the oscilloscope screen refresh cycles are basically the same, when the time base of the oscilloscope is larger, i.e. at slow time-base, the time of acquiring a frame of waveform will be greater than the screen refresh circle. At this point, all the data acquired in the screen refresh cycle are read out, and still can't form a frame of complete waveform, thus, "scan mode" is adopted to display the waveform.

The waveform display in scan mode is that the newly acquired waveform appears at the far right of the screen and the previously acquired waveform moves to the left for the corresponding length of time. When the waveform is continuously updated, a waveform that moves from the right to the left will be displayed on the screen of the oscilloscope.

The display technology of modern digital storage oscilloscope (DSO) is also constantly upgrading, the high-end digital storage oscilloscopes at the present stage generally have fluorescent waveform display. The fluorescence waveform display is realized through the three-dimensional (3D) mapping, i.e. the probability statistics and superposition of multiple frames of waveform. The advantages of the fluorescent waveform display is that it not only shows the variation of waveform amplitude with time, but also shows the probability of waveform amplitude at a specific time.

However, the three-dimensional mapping needs to acquire multiple frames of waveform in one screen refresh cycle, and in the traditional scan mode, the digital storage oscilloscope at slow time-base will spend a long time acquiring a frame of waveform, a whole frame of waveform can't be acquired in one screen refresh cycle. Therefore, multiple frames of waveform for three-dimensional mapping can't be obtained in scan mode, then there is no fluorescent waveform display on the screen of digital storage oscilloscope.

SUMMARY OF THE INVENTION

The present invention aims to overcome the deficiencies of the prior art and provides a method for oscilloscope 3D (three-dimensional) mapping in scan mode, so that the fluorescent waveform display can be realized at slow time-base, i.e. in scan mode.

To achieve these objectives, in accordance with the present invention, a method for oscilloscope 3D mapping in scan mode is provided, comprising:

(1) reading of acquired data 1.1) setting digital storage oscilloscope's (DSO's) real-time sampling rate $f_s$ as:

$$f_s = \frac{D_r \times N}{B} \quad (1)$$

where $D_r$ is the number of points for mapping for each column of a DSO's screen, N is the number of columns of each horizontal grid on the DSO's screen, B is a time base, i.e. the time represented by a horizontal grid;

introducing a flag X into the three-dimensional database of the DSO, which points to the column where three-dimensional compression mapping is performed;

letting the DSO acquire an input signal at real-time sampling rates $f_s$, and store the acquired data into a FIFO memory;

1.2) when the screen refresh signal arrives, reading out the first $D_s$ acquired data from the unread acquired data in FIFO memory, where the total number of the unread acquired data is $D'_s$, and $D_s$ can be obtained according to equation (2):

$$D_s = D'_s - D'_s \% D_r \quad (2)$$

where % is remainder operator;

(2) three-dimensional compression mapping 2.1) value resetting writing data 0 to the column pointed to by the flag X, i.e. to the $A_s$ addresses from address $X \times R_y$ to $X \times R_y + A_s - 1$ of the three-dimensional database of the DSO, when the address $X \times R_y + A_s - 1$ is greater than or equal to $R_x \times R_y$, i.e. out of the address range of the three-dimensional database, the corresponding address is changed to $X \times R_y (X \times 240 | A_s) + A_s - 1 - R_x \times R_y$, where $R_x$ is the horizontal resolution of the DSO, $R_y$ is the vertical resolution of the DSO, and the number $A_s$ of reset addresses is:

$$A_s = \frac{D_s}{D_r} \times R_y \quad (3)$$

2.2) data mapping performing data mapping in turn to the first $D_s$ acquired data which are read out in step (1): reading out the value of address Y of the three-dimensional database, and adding 1 to the value of address Y, then writing the value of address Y back to address Y of the three-dimensional database, where address Y of the three-dimensional database is:

$$Y = (X \times R_y) + (R_y - V - 1) \quad (4)$$

where V is the value of the acquired data;

where in the process of data mapping, after each $D_r$ acquired data are mapped, the flag X is updated: if X+1 is equal to $R_x$, then X=0, else X=X+1;

(3) importing to video memory after the data mappings of all the $D_s$ acquired data are completed, importing the values of the three-dimensional database into the video memory of the DSO from the column pointed to by the flag X, i.e. from the starting address $X \times R_y$, to display the waveform, where in the process of importing, when reaching the address $R_x \times R_y - 1$, the importing continues from the address 0 until the address $X \times R_y - 1$;

then returning to the step 1.2) for the next three-dimensional compression mapping and importing to video memory.

The objectives of the present invention are realized as follows:

The spacing between two consecutive horizontal pixels on the screen of a DSO represents a certain time, and the reciprocal of this time is the sampling rate that the current signal under measurement needs. In present invention, i.e. method for oscilloscope 3D mapping in scan mode, the input signal is acquired using a real-time sampling rate which is $D_r$ times higher than the aforementioned sampling rate, thus more sampling points, i.e. $D_r$ acquired data can be obtained during the time interval between two consecutive horizontal pixels. The $D_r$ acquired data are mapped into a same column of the screen to implement fluorescent waveform display. In addition, to realize the scanning display that the waveforms scroll from the right to the left of the screen, the addresses of the three-dimensional database (which is used to record the probability information of sampling points in each position, i.e. column of the screen) are designed as an end-to-end structure, and a flag X is introduced into the three-dimensional database, when the screen refresh signal arrives, the first $D_s$ acquired data are read out from the unread acquired data in FIFO memory. The three-dimensional database is updated, i.e. performs value resetting and data mapping from the flag X, and in the process of updating, the flag X is also updated to keep it always pointing to the column which is needed to update. When the waveform is to be displayed, the values of the three-dimensional database are imported into the video memory of the DSO from the column pointed to by the flag X, until the column before the column pointed to by the flag X, which make the leftmost waveform always be the oldest waveform, the rightmost waveform always be the newest waveform. Thus the 3D mapping is realized in scan mode, letting the DSO have a fluorescent waveform display at slow timebase.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
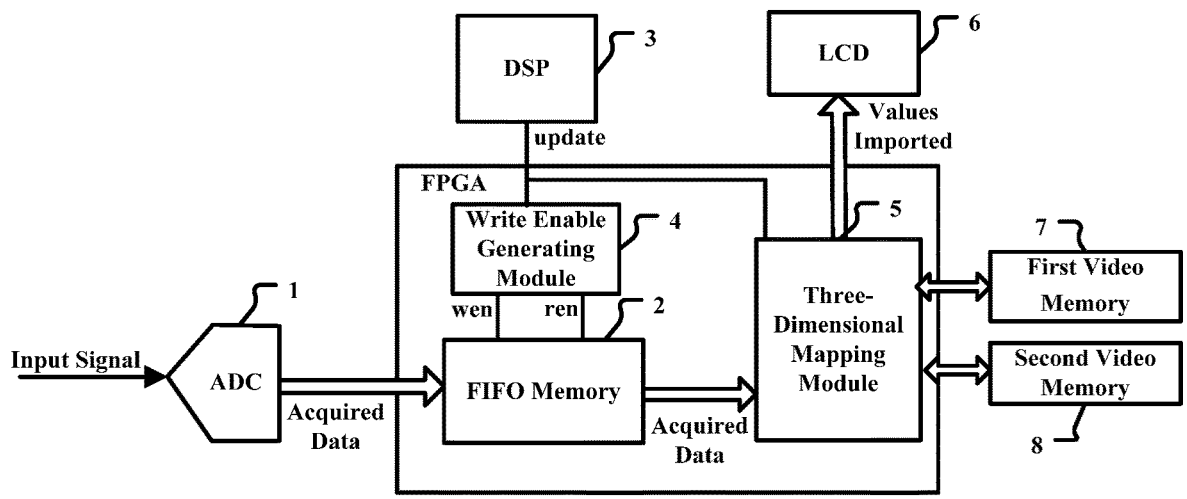
FIG. 1 is a block diagram of a DSO to which one embodiment of the present invention is applied.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

The core of the present invention is that: in scan mode, the DSO acquires the input signal by using a higher sampling rate, so that a plurality of acquired data can be obtained during the time interval represented by the spacing between two consecutive horizontal pixels on the screen of the DSO, and then the plurality of acquired data are mapped into the pixels of a same column of the screen of DSO by using the three-dimensional mapping technology, thus a fluorescent waveform display is realized. In present invention, three-dimensional compression mapping, as well as the scanning display are realized by introducing the flag X.

FIG. 1 is a block diagram of a DSO to which one embodiment of the present invention is applied.

In one embodiment, as shown in FIG. 1, A DSO comprises an ADC 1, a FPGA, a DSP 3, a LCD 6, a first video memory 7 and a second video memory 8, where the FPGA further comprises a FIFO memory 2, a read-write enable generating module 4 and a three-dimensional mapping module 5.

the ADC 1 acquires the input signal and sends the acquired data to the FIFO memory 2. In the embodiment, the reading and writing enable generating module 4 generates a writing enable signal wen to keep the write enable of the FIFO memory 2 turned on all the time, thus the DSO will perform the data acquisition continuously. DSP 3 controls all operations of the DSO, and sends a screen refresh signal update to the read and write enable generating module 4 at each cycle. Upon the receipt of the screen refresh signal update, the read and write enable generating module 4 generates a read enable signal ren, which make the unread acquired data in the FIFO memory 2 be read out and sent to the three-dimensional mapping module 5 for three-dimensional compression mapping. After three-dimensional compression mapping, the values in the three-dimensional database are alternately imported into the first video memory 7 and the second video memory 8, and when one video memory is in the process of importing, the other video memory will send the values imported to the screen of the DSO for waveform display under the control of the three-dimensional mapping module 5. In the embodiment, the LCD 6 is adopted as the screen of the DSO. The importing to video memory and waveform display of the screen belong to the prior art of DSO, the elaborate description is omitted.

Figure 2:
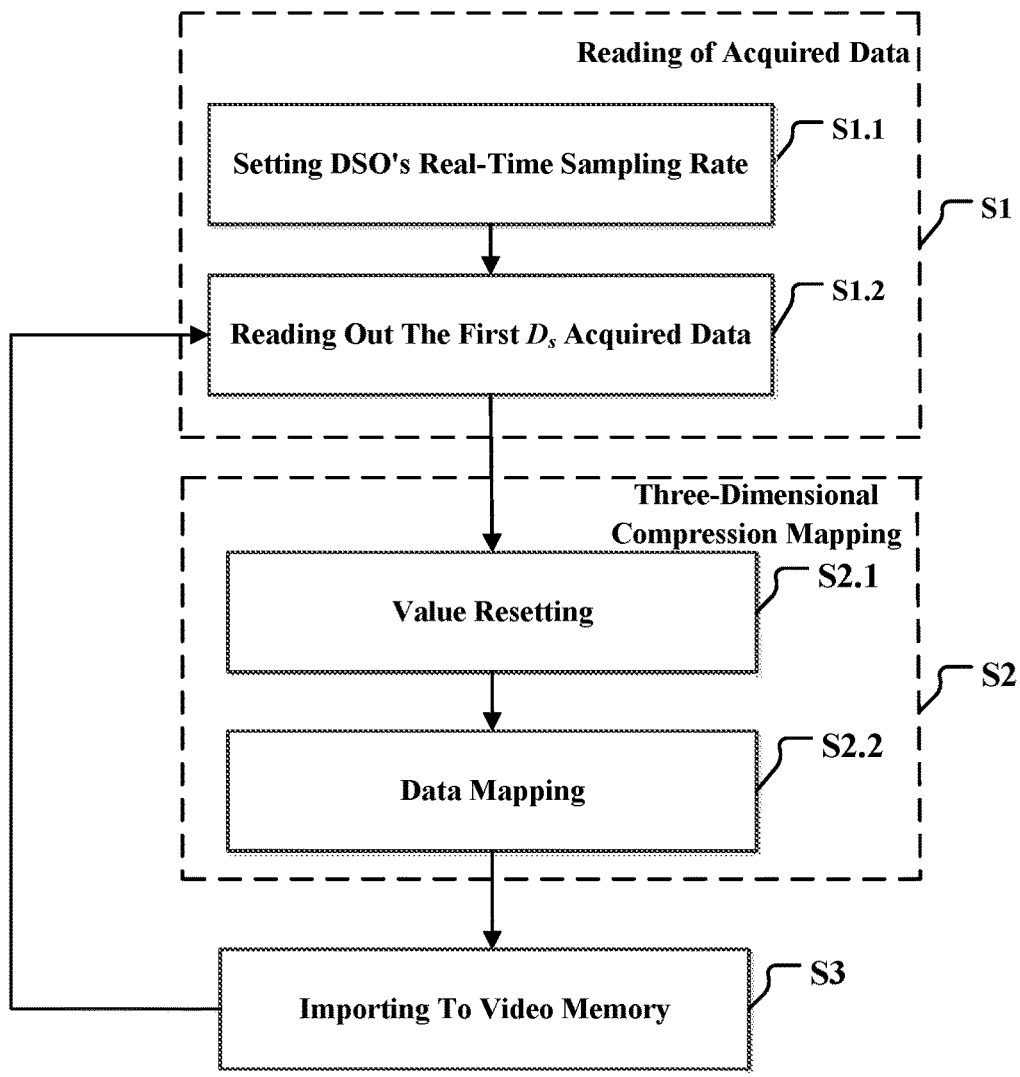
FIG. 2 is a flowchart of a method for oscilloscope 3D (three-dimensional) mapping in scan mode according to one embodiment of the present invention.

FIG. 2 is a flowchart of a method for oscilloscope 3D (three-dimensional) mapping in scan mode according to one embodiment of the present invention.

In one embodiment, as shown in FIG. 2, a method for oscilloscope 3D mapping in scan mode is provided, comprising:

Step S1: reading of acquired data

Step S1.1: setting digital storage oscilloscope's (DSO's) real-time sampling rate $f_s$ as:

$$f_s = \frac{D_r \times N}{B} \quad (1)$$

where $D_r$ is the number of points for mapping for each column of a DSO's screen, N is the number of columns of each horizontal grid on the DSO's screen, B is a time base, i.e. the time represented by a horizontal grid.

In the embodiment, the number of points for mapping for each column of the DSO's screen is 100, i.e. $D_r=100$, the number of columns of each horizontal grid on the DSO's screen is 50, i.e. N=50. The current time base is chosen as 500 ms/div, then according to equation (1), the current real-time sampling rate of DSO $f_s$ is:

$$f_s = \frac{D_r \times N}{B} = \frac{100 \times 50}{500 \text{ ms}} = 10 \text{ Ksps}.$$

Letting the DSO acquire an input signal at real-time sampling rates 10 Ksps, and store the acquired data into a FIFO memory.

Step S1.2: when the screen refresh signal arrives, reading out the first $D_s$ acquired data from the unread acquired data in FIFO memory, where the total number of the unread acquired data is $D'_s$, and $D_s$ can be obtained according to equation (2):

$$D_s = D'_s \% D_r \quad (2)$$

where % is remainder operator.

In the process of data acquisition, the acquired data is calculated, while waiting for the arrival of the screen refresh signal. When the screen refresh signal arrives, the total number of acquired data $D'_s$, is obtained. In order to complete a column entirely during the three-dimensional compression mapping, it is necessary to guarantee that the total number of data for the three-dimensional compression mapping is an integral multiple of the number of points for mapping for each column of a DSO's screen. Therefore, as shown in equation (2), it is required to subtract a value from the total number of acquired data $D'_s$, so that the number of acquired data $D_s$ for the three-dimensional compression mapping is the maximal integral multiple of the number of points $D_r$ for mapping for each column of a DSO's screen. The remainder of the acquired data is left to the three-dimensional compression mapping of the next cycle. Supposing the number of the remainder of the acquired data is $D_o$, the number of acquired data obtained in a new acquisition, i.e. during the time interval between the new screen refresh signal and the previous screen refresh signal, is $D_n$, the total number of acquired data $D'_s$ is $D'_s = D_n + D_o$.

Since the total number of acquired data $D'_s$ is the total number of the acquired data which are not read out when the screen refresh signal arrives, the total number of the unread acquired data is $D'_s$. Moreover, since the acquired data is always stored in FIFO memory, and the acquired data will not be reset, the remainder of the acquired data will not be lost. In addition, although the ADC acquires the input signal continuously during the three-dimensional compression mapping, the FIFO memory will not be filled fully due to the slow acquisition, this ensures the continuity and integrity of the acquired data.

In the embodiment, when the first screen refresh signal arrives, 415 data are acquired, which are unread acquired data, that is, $D'_s=415$. According to the equation (2), the number of points mapping for each column of a DSO's screen $D_r=100$, the first $D_s$ acquired data are needed to readout, that is, $D_s=400$.

Step S2: three-dimensional compression mapping

Step S2.1: value resetting

Figures 3, 4:
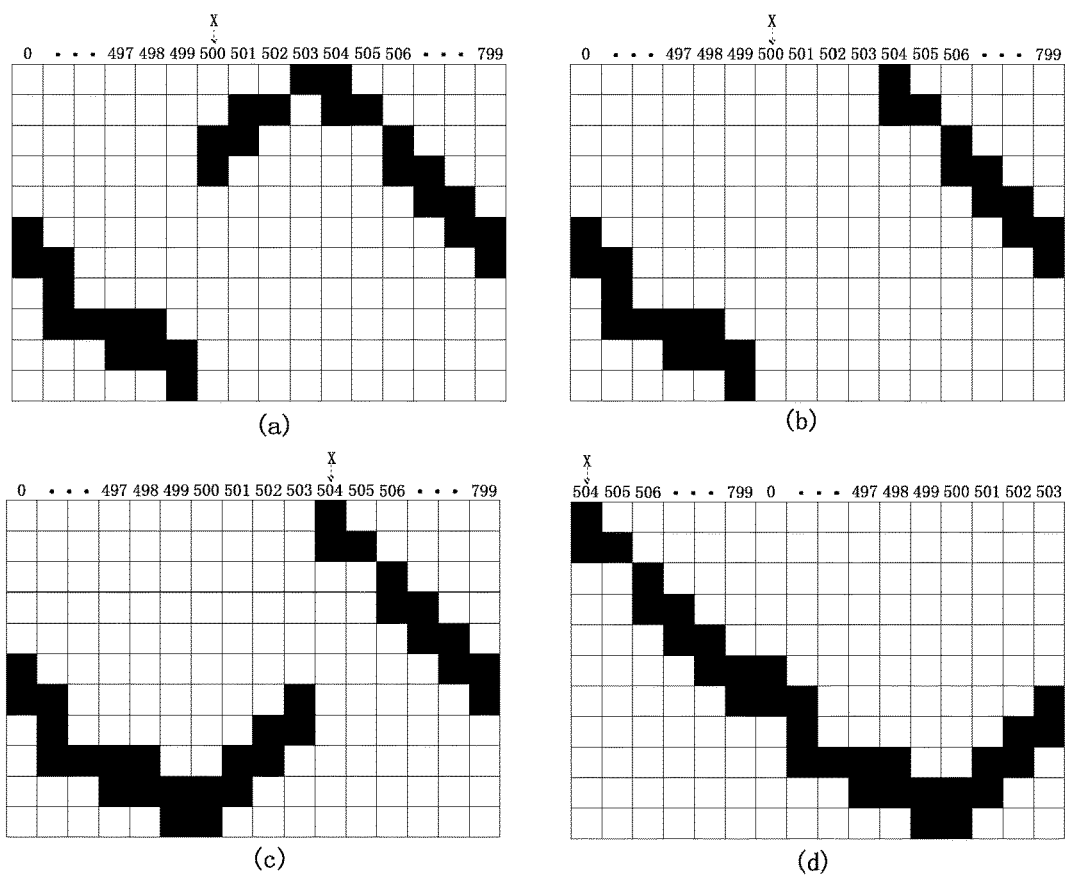
FIG. 3 is a diagram of one embodiment of the three-dimensional database in present invention.
FIG. 4 are diagrams of value resetting, data mapping and importing to video memory according to one embodiment of the present invention, where (a) is the three-dimensional database before three-dimensional compression mapping, (b) is the three-dimensional database after value resetting, (c) is the three-dimensional database after data mapping, (d) is the video memory after importing.

In three-dimensional compression mapping phase, the first to do is resetting the corresponding addresses of the three-dimensional database according to the number of columns of data mapping, i.e. writing data 0 to corresponding addresses of a SRAM, the arrangement of the SRAM's addresses of a three-dimensional database depends on the actual size of DSO's screen, the horizontal resolution of the DSO is $R_x$, the vertical resolution of the DSO is $R_y$. In the embodiment, as shown in FIG. 3, the arrangement of the SRAM's addresses of a three-dimensional database is drawn with a horizontal resolution $R_x$ of 800 and a vertical resolution $R_y$ of 240. Hereinafter, the three-dimensional database is used as an example to describe the present invention in details.

Because the screen refresh take column as a unit, the numbers of the addresses to be reset and the address to be mapped are both multiple times of $R_y$, the relation between the number $A_s$ of reset addresses and the number $D_s$ of acquired data is as follows:

$$A_s = \frac{D_s}{D_r} \times R_y \quad (3)$$

In the embodiment, the number $A_s$ of reset addresses is:

$$A_s = \frac{D_s}{D_r} \times R_y = \frac{400}{100} \times 240 = 960$$

In the present invention, a flag X is introduced into the three-dimensional database, and the flag X points to the column where three-dimensional compression mapping is performed, the value of the flag X ranges from 0 to $R_x$. In the embodiment, the value of the flag X ranges from 0 to 799, the initial value of the flag X is 0. Value resetting is from the column pointed to by the flag X, i.e. writes data 0 to the $A_s$ addresses from address $X \times R_y$ to $X \times R_y + A_s - 1$ of the three-dimensional database. When the address $X \times R_y + A_s - 1$ is greater than or equal to $R_x \times R_y$, i.e. out of the address range of the three-dimensional database, the corresponding address is changed to $X \times R_y (X \times 240 | + A_s 1 - R_x \times R_y$, where $R_x$ is the horizontal resolution of the DSO, $R_y$ is the vertical resolution of the DSO. In the embodiment, When the address $X \times R_y + A_s - 1$ is greater than the maximal address 191999, the value resetting starts from address 0. The waveforms in three-dimensional database before and after value resetting are shown in FIG. 4(a) and FIG. 4(b) respectively, where the black blocks represent the waveform data, the white blocks represent that there are no waveform data.

Step S2.2: data mapping

Data mappings are performed in turn to the first $D_s$ acquired data which are read out in step S1: the value of address Y of the three-dimensional database is read out, adding 1 to it, then written back to address Y of the three-dimensional database, where address Y of the three-dimensional database is:

$$Y=(X\times R_y)+(R_y-V-1) \quad (4)$$

where V is the value of the acquired data;

where in the process of data mapping, after each $D_r$ acquired data are mapped, the flag X is updated: if X+1 is equal to $R_x$, then X=0, else X=X+1.

After value resetting, there is data mapping. In the embodiment, the value of acquired data ranges 0~256, which represents the amplitude of waveform, in order to match the number of the rows of the three-dimensional database, the value greater than $R_y$-1, ie, 239, is taken as $R_y$-1, ie, 239. Address Y of three-dimensional database which corresponds to value V is:

$$Y=(X\times R_y)+(R_y-V-1)=(500\times 240)-(240-V-1)=12000-(240-V-1)$$

In the embodiment, data mappings are performed in turn to the first $D_s$, i.e. 400 acquired data which are read out in step S1: the value of address Y of the three-dimensional database is read out and added 1, then written back to address Y of the three-dimensional database. In the process of data mapping, after each $D_r$, i.e. 100 acquired data are mapped, namely the mapping of a column's data is completed, the flag X is updated: if X+1 is equal to $R_x$, then X=0, else X=X+1. In the embodiment, the 1st to 100th acquired data in data mapping will be mapped to the corresponding addresses, i.e. address 120000 to 120239, after the 100 acquired data are mapped, the flag X will be increased by 1, i.e. X=501; The 101th to 200th acquired data in data mapping will be mapped to the corresponding addresses, i.e. address 120240 to 120479, after the 100 acquired data are mapped, the flag X will be increased by 1, i.e. X=502. Similarly, when all 400 acquired data are mapped, X=504. The waveforms in three-dimensional database before and after three-dimensional compression mapping are shown in FIG. 4(a) and FIG. 4(c) respectively, where the black blocks represent the waveform data, the white blocks represent that there are no waveform data.

When the flag X=799 and the flag is updated, X+1=800, that is, X+1 is equal to $R_x$, then X=0.

Step S3: importing to video memory

After the data mappings of all the $D_s$ acquired data are completed, importing the values of the three-dimensional database into the video memory of the DSO from the column pointed to by the flag X, i.e. from the starting address $X\times R_y$ to display the waveform, where in the process of importing, when reaching the address $R_x\times R_y-1$, the importing continues from the address 0 until the address $X\times R_y-1$.

Then returning to the Step S1.2 for the next three-dimensional compression mapping and importing to video memory.

In the embodiment, after the data mapping of all the $D_s$ acquired data is completed, the importing to video memory starts. When importing to video memory, as shown in FIG. 4(d), it is from the column pointed to by flag X, i.e. from the starting address $X\times R_y$. In the embodiment, the starting address for importing to video memory is 504×240, instead of address 0, for the waveform display is shown in scanning, i.e. the waveforms scroll from the right to the left of the screen, the new waveform constantly replaces the old waveform. Importing from the column pointed to by flag X can ensure that the latest waveform mapped in, i.e. the newest waveform is displayed on the rightmost screen of DSO, the oldest waveform is on the leftmost screen of DSO. Thus repeating the circle of data three-dimensional compression mapping and importing to video memory continuously, the scanning waveform display is shown on the screen of DSO.

In the embodiment, the importing to video memory is from the column pointed to by flag X, i.e. from address 120960, after reaching address 191999, it starts from address 0 again, until address 12059.

Figure 5:
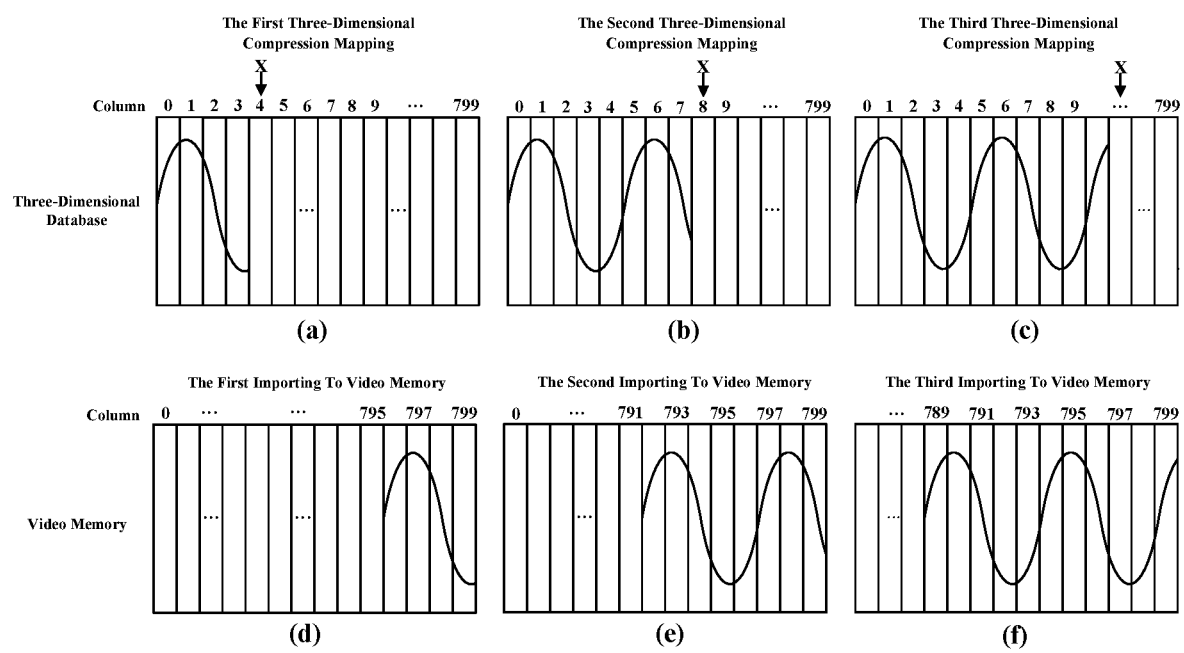
FIG. 5 are address translation diagrams in a three-dimensional database and corresponding waveform display diagrams in a video memory when importing to the video memory according to one embodiment of the present invention, where (a) is the three-dimensional database after the first three-dimensional compression mapping, (b) is the three-dimensional database after the second three-dimensional compression mapping, (c) is the three-dimensional database after the third three-dimensional compression mapping, (d) is the video memory after the first importing, (e) is the video memory after the second importing, (f) is the video memory after the third importing.

FIG. 5 are address translation diagrams in a three-dimensional database and corresponding waveform display diagrams in a video memory when importing to the video memory according to one embodiment of the present invention.

In the embodiment, when the first screen refresh signal arrives, 415 data are acquired, all of them are unread read data, i.e, $D_s$=415. Thus the first $D_s$, i.e., 400 acquired data are read out for three-dimensional compression mapping. The initial value of flag X is 0, then the addresses to be reset in the three-dimensional database range from 0 to 959. After the value resetting, the data mapping starts. In the process of data mapping, after each 100 acquired data are mapped, the flag X is increased by 1. Thus, as shown in FIG. 5(a), after 400 acquired data are mapped, the flag X=4. After the three-dimensional compression mapping is completed, the importing to video memory starts from the column pointed to by flag X. Here flag X=4, the importing to video memory starts from the 4th column. Firstly, the data from the 4th column to 799th are sent to the video memory, then the data from the 0th to 3rd column are sent to the video memory. After the importing to video memory is completed, only the column 796 to 799 have data in the video memory, due to no data in column 4 to 799 and data in column 0 to 3. Thus, as shown in FIG. 5(d), only 4 columns on the rightmost screen of DSO have waveform data.

When the second screen refresh signal arrives, 405 data are acquired, and 15 acquired data are left after the first reading, then the number $D'_s$ of unread acquired data is 420. According to equation (2), the number $D_s$ of acquired data to be read out is 400, the value resetting and data mapping starts from the column X (X=4). After each 100 acquired data are mapped, the flag X is increased by 1. Thus, as shown in FIG. 5(b), after 400 acquired data are mapped, the flag X=8. After the three-dimensional compression mapping is completed, the importing to video memory starts from the column pointed to by flag X. Here flag X=8, the importing to video memory starts from the 8th column. Firstly, the data from the 8th column to 799th are sent to the video memory, then the data from the 0th to 7th column are sent to the video memory. After the importing to video memory is completed, only the column 792 to 799 have data in the video memory, due to no data in column 8 to 799 and data in column 0 to 7. Thus, as shown in FIG. 5(e), the waveform data of the first three-dimensional compression mapping are moved 4 columns to the left, the waveform data of the second three-dimensional compression mapping are displayed on the rightmost 4 columns of the DSO's screen. Similarly, as shown in FIGS. 5(c), 5(f), after the third three-dimensional compression mapping and importing to video memory is completed, the waveform data of the third three-dimensional compression mapping are displayed on the rightmost 4 columns of the DSO's screen, the previous waveforms are moved 4 columns to the left accordingly. Thus the 3D mapping is realized in scan mode, letting the DSO have a fluorescent waveform display at slow time-base.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A method for oscilloscope 3D mapping in scan mode, comprising:
   (1) reading of acquired data
      1.1) setting a real-time sampling rate $f_s$ of a digital storage oscilloscope (DSO) as:

$$f_s = \frac{D_r \times N}{B} \quad (1)$$

where $D_r$ is the number of points for mapping for each column of a screen of the DSO, N is the number of columns of each horizontal grid on the screen, and B is a time base represented by a horizontal grid;
      introducing a flag X into a three-dimensional database of the DSO, which points to a column where a three-dimensional compression mapping is performed;
      letting the DSO acquire an input signal at the real-time sampling rate $f_s$, and store acquired data into a FIFO memory;
      1.2) when a screen refresh signal arrives, reading out a first $D_s$ acquired data from unread acquired data in FIFO memory, where a total number of the unread acquired data is $D'_s$, and $D_s$ can be obtained according to an equation (2):

$$D_s = D'_s - D'_s \% D_r \quad (2)$$

where % is a remainder operator;
   (2) three-dimensional compression mapping
      2.1) value resetting
      writing data 0 to the column pointed to by the flag X to a plurality of addresses $A_s$ from a starting address $X \times R_y$ to an address $X \times R_y + A_s - 1$ of the three-dimensional database of the DSO, when the address $X \times R_y + A_s - 1$ is greater than or equal to an address $R_x \times R_y$ out of the address range of the three-dimensional database, a corresponding address is changed to $X \times R_y (X \times 240 + A_s) + A_s - 1 - R_x \times R_y$, where $R_x$ is a horizontal resolution of the DSO, $R_y$ is a vertical resolution of the DSO, and the number $A_s$ of a plurality of reset addresses is:

$$A_s = \frac{D_s}{D_r} \times R_y \quad (3)$$

2.2) data mapping
      performing data mapping in turn to the first $D_s$ acquired data which are read out in step (1) as follows: reading out a value of an address Y of the three-dimensional database, and adding 1 to the value of the address Y, then writing the value of the address Y back to the address Y of the three-dimensional database, where the address Y of the three-dimensional database is:

$$Y = (X \times R_y) + (R_y - V - 1) \quad (4)$$

where V is the value of the acquired data;
      where in the process of data mapping, after each point for mapping $D_r$ acquired data are mapped, the flag X is updated such that if X+1 is equal to $R_x$, then X=0, else X=X+1;
   (3) importing to video memory
      after the data mapping of all the $D_s$ acquired data is completed, importing the values of the three-dimensional database into a video memory of the DSO from the column pointed to by the flag X from the starting address $X \times R_y$ to display a waveform, where in the process of importing, when reaching an address $R_x \times R_y - 1$, the importing continues from an address 0 until an address $X \times R_y - 1$;
      then returning to the step 1.2) for a next three-dimensional compression mapping and importing to the video memory.

* * * * *